United States Patent [19]
Kaneko et al.

[11] 3,858,121
[45] Dec. 31, 1974

[54] SOLID STATE MICROWAVE OSCILLATOR WITH STABILIZING RESONATOR AND AFC LOOP

[75] Inventors: Yoichi Kaneko, Tokorozawa; Katsuhiro Kimura, Tokyo, both of Japan

[73] Assignee: Hitachi, Ltd., Tokyo, Japan

[22] Filed: Aug. 17, 1973

[21] Appl. No.: 389,269

[30] Foreign Application Priority Data

Aug. 25, 1972 Japan ................................ 47-84540

[52] U.S. Cl. ...................... 331/9, 331/26, 331/36 C, 331/96, 331/107 R, 331/107 G, 331/177 V

[51] Int. Cl. ........................... H03b 3/04, H03b 7/14

[58] Field of Search ...... 331/9, 26, 36 C, 96, 107 R, 331/107 G, 117 V, 1 R

[56] References Cited

UNITED STATES PATENTS 3,457,521 7/1969 Tamura et al. ......................... 331/9
3,617,944 11/1971 Honda et al. ....................... 331/9 X
3,705,364 12/1972 Takeshima ................. 331/107 G X
3,711,792 1/1973 Kaneko et al. ................ 331/36 C X

*Primary Examiner*—Siegfried H. Grimm
*Attorney, Agent, or Firm*—Craig & Antonelli

[57] ABSTRACT

A stabilized solid-state oscillator comprising a free running oscillator with its frequencies made variably by a variable reactance element, a high-Q fundamental cavity resonator coupled to the output line of the free running oscillator for controlling the oscillation frequency by phase locking and a diode phase detector coupled with the same output line; characterized in that variations of the oscillation frequency are detected as the amount of phase variations of the wave reflected from the fundamental cavity resonator, so that frequency variations of the free running oscillator are restricted by an AFC circuit.

8 Claims, 4 Drawing Figures

SOLID STATE MICROWAVE OSCILLATOR WITH STABILIZING RESONATOR AND AFC LOOP

The present invention relates to a solid-state oscillator and more in particular to a solid-state oscillator using a Gunn element or IMPATT oscillator element.

In conventional solid-state oscillators using a Gunn element or IMPATT diode, the oscillation frequency varies greatly with the ambient temperature due to the high temperature coefficient of the element. For the purpose of application of such an oscillator to communication equipment and radar equipment, an attempt has been made to stabilize the oscillation frequency within a certain phase locking range by means of a cavity resonator having a high-Q.

A well-knownsolid-state oscillator with a stabilizing cavity resonator has the construction such as is shown in FIG. 1.

An oscillator element 1 is mounted within a waveguide 2 and a direct current is supplied through RF chokes 4 and a post 3.

At one end of the waveguide is mounted a short-circuiting means 20 thereby to make up a free running oscillator generally indicated by reference numeral 8.

A stabilizing cavity resonator 11 is arranged on the output line 10 of the free running oscillator 8 by being coupled thereto by the coupling hole 12.

The frequency of the free running oscillator 8 is determined by the length from the post 3 to the short-circuiting means 20. The use of the cavity resonator 11 with high-Q and selection of an appropriate degree of coupling thereof permits the general oscillation frequency to be determined mainly by the cavity resonator 11 within a certain phase locking range. By employing such a stabilizing means, it is possible to improve by more than one order the stability of the oscillation frequency as compared with when the free running oscillator is solely employed.

The prior art stabilizing means has the disadvantage that a strengthened degree of coupling of the cavity resonator causes the phase locking range to be increased, whereas a less improved stability results from a reduced Q beyond an optimum point thereof. Thus it is difficult to secure a sufficiently large phase locking range without deterioration of the improvement of stability, resulting in the likelihood of occurrence of such troubles as phase locking failure of the oscillator due to excessive variations in the frequency of the free running oscillator.

Further, the improvement in the stability of oscillation frequency by the conventional stabilizing means is not sufficiently high.

An object of the present invention is to provide a solid-state oscillator with an extremely high stability in oscillation frequency comprising a stabilizing cavity resonator of which the phase locking failure is prevented.

To achieve the aforementioned objects, taking into consideration the fact that the phase of the wave reflected from the fundamental cavity resonator varies with high sensitivity with frequency variations of the free running oscillator within the phase locking range of the stabilizing fundamental cavity resonator, the present invention is characterized in that the amount of the frequency variations is detected in the form of the amount of phase variations of the reflected wave, so that an automatic frequency control circuit (hereinafter referred to as "an AFC circuit") is energized in such a manner as to attain a correspondence between the oscillation frequency and the resonance frequency of the fundamental cavity resonator on the basis of the amount of detected phase variations, thereby to accomplish the adjustment of the free running oscillator.

The above and other objects, features and advantages will be made apparent from the detailed description taken in conjunction with the accompanying drawings, in which.

Figure 1:
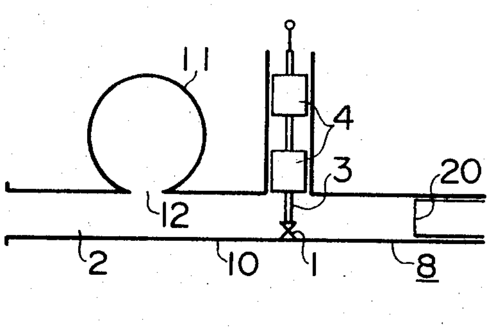
FIG. 1 PRIOR ART
FIG. 1 is a schematic diagram showing a sectional view of a solid-state oscillator coupled with a conventional stabilizing cavity resonator.
Figure 2:
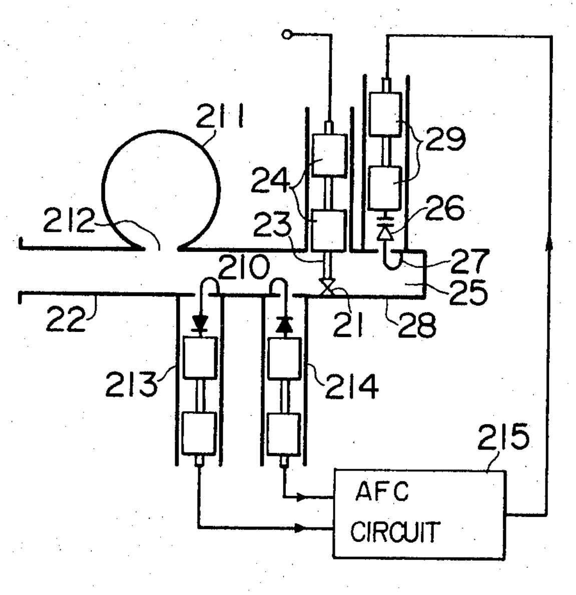
FIG. 2 is a diagram showing an embodiment of the present invention.

Referring to FIG. 2 showing an embodiment of the oscillator according to the present invention, reference numeral 21 shows an oscillator element mounted within a waveguide 22 and connected to a post 23. Reference numeral 24 shows RF chokes for supplying a direct current to the element 21 and preventing the leakage of high-frequency energy outside.

A resonator 25 of the waveguide type is connected to a varactor diode 26 through a loop 27 thereby to form a free running oscillator 28.

The free running oscillator 28 is such that the adjustment of the circuit to resonance is accomplished by a bias voltage applied to the oscillator 28 through the RF chokes 29. The oscillation output from the free running oscillator 28 is applied leftward in the drawing by way of the line 210. On the output line 210 are provided a fundamental cavity resonator 211 and a coupling hole 212. The fundamental cavity resonator 211 is made of a metal material such as super invar with low coefficient of thermal expansion and has an interior finished with silver plating, so that no-loaded Q of several thousands or more is achieved for the working frequencies.

The coupling hole 212 is spaced from the oscillator element 21 equivalently by an integral multiple of one half of the guide wavelength. Two diode detectors 213 and 214 are inserted between the free running oscillator 28 and the fundamental cavity resonator 211. Signals obtained from their terminals are processed by the AFC circuit 215 and fed back to the varactor diode 26.

In this arrangement, a bias voltage is applied to the oscillator element 21 of the free running oscillator 28 and the varactor diode 26. In the event that the oscillation frequency agrees with the resonance frequency of the fundamental cavity resonator 211, a resonant parallel resistance given by the fundamental cavity resonator is inserted in series with the line, so that part of the output from the free running oscillator 28 is reflected from the fundamental cavity resonator 211, with the result that a standing wave occurs on the output line 210 due to the presence of the wave entering the fundamental cavity resonator 211. In the case where the oscillation frequency does not agree with the resonance frequency of the fundamental cavity resonator 211, by contrast, a complex impedance of the resonator is introduced in series with the line, whereby a reflected wave with a different phase from the one at resonance is generated on the side of the free running oscillator. The phase variations of the reflected wave correspond to the variations in the position where the voltage of the standing wave is minimum on the output line 210.

Figure 3:
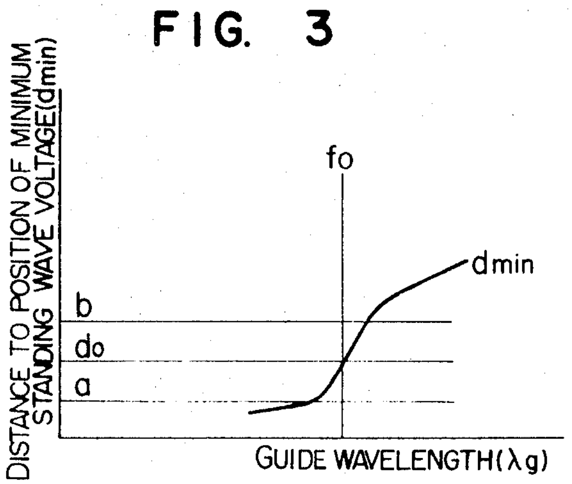
FIG. 3 is a graph for explaining the operation of the device according to the invention.

The diagram of FIG. 3 shows variations of position of minimum standing wave voltage according to the phase variations due to the oscillation frequency variations.

In FIG. 3, the abscissa represents the guide wavelength λg determined by the frequency and the ordinate the distance from the fundamental cavity resonator to the position where the standing wave voltage is minimum. At the resonance frequency $f_0$ of the fundamental cavity resonator, the point where the standing wave voltage is minimum is located to the right of the coupling hole by one fourth of the guide wavelength or the position shown by $d_0$. The diode detectors 213 and 214 are arranged at points *a* and *b* respectively each of which is located on both sides of point $d_0$ at the distance of one eighth of the guide wavelength from the point $d_0$. As a result, in the event that sensitivities of the detectors are equal to each other at resonance frequency $f_0$, DC signals of opposite polarities and with the same magnitude are generated from the detectors.

When the oscillation frequency exceeds $f_0$, the point where the standing wave voltage is minimum approaches point *a* along the solid curve indicated by dmin, while the point *b* at the distance of one fourth of the guide wavelength from point *a* approaches a point where the standing wave voltage is maximum.

Conversely, if the oscillation frequency is reduced below $f_0$, the point where the standing wave voltage is minimum approaches point *b*, while the point where the standing wave voltage is maximum comes near to point *a*.

Therefore, by locating diode detectors at points *a* and *b* for the detection of high-frequency electric field or magnetic field on the output line 210, it is possible to detect the deflection of the oscillation frequency from $f_0$. In the embodiment under consideration, the diode detectors are for detecting the magnitude of the magnetic field in the waveguide through a loop and have the characteristics that with the approach of the point of minimum standing wave voltage, the detection current or voltage is increased. According to the embodiment, the signals produced from the two diode detectors are opposite in polarity, so that the deflection of oscillation frequency is immediately detected on the basis of the difference between and polarity of those output voltages. The resulting signal is amplified by the AFC circuit 215 and fed back to the bias voltage of the varactor diode 26 thereby to minimize the deflection of the oscillationn frequency.

In other words, when the oscillation frequency exceeds $f_0$, the signal from the diode detector 213 is increased, so that a voltage or current representing its magnitude less the magnitude of the signal from the diode detector 214 is amplified by the AFC circuit 215. The AFC circuit is such that a predetermined fixed bias voltage is applied to the varactor diode 26 to which an amplified difference between the voltages from the two diode detectors is applied. Under this operating condition, the bias voltage applied to the varactor diode is reduced thereby to increase the capacitance thereof, thus causing it to operate to reduce the frequency of the free running oscillator to the reference $f_0$. This principle of operation also applies to cases where the oscillation frequency is lower than $f_0$.

In view of the fact that the addition of the fundamental cavity resonator 211 enables the variations of the oscillation frequency of the free running oscillator 28 to be stabilized by more than one order, the oscillator according to the invention is capable of supplying a highly stable oscillation output to a load (not shown). For this purpose, a suitable size of the coupling hole of the fundamental cavity resonator 211 should be so selected that the standing wave ratio is 2 or more.

In the conventional method of frequency stabilization by the use of a cavity resonator, the variations of oscillation frequency within a certain phase locking range persist. According to the arrangement presented herein, the deflection of frequency is discriminated and minimized automatically, so that a stability substantially equal to the temperature coefficient of the fundamental cavity resonator is obtained. For example, the frequency stability of $10^{-7}$ $^{per}$°C to $10^{-8}$ $^{per}$°C is achieved by employing a super invar for the fundamental cavity resonator or by effecting temperature compensation.

Further, the present invention is effective to prevent the phase locking failure which otherwise might occur with the lapse of working time of the element.

Furthermore, in place of the cavity resonator used in the aforementioned embodiment as the fundamental resonator, a dielectric material or magnetic material with high-Q and low temperature coefficient may be employed as the fundamental resonator.

In the preceding embodiment where a varactor diode is used as a means for adjusting the free running oscillator to resonance, if a Gunn element or avalanche diode is employed as an oscillator element, the same operation as that aforementioned is achieved by directly changing the bias voltage or current of the Gunn element or avalanche diode, as the case may be, thereby to give the functions of a variable reactance element to them.

Although in the embodiment of FIG. 2 the amount of phase variations of reflected wave is detected in the form of variations of the position where the standing wave voltge is minimum for the purpose of frequency stabilization, the present invention is not limited to such a method but may be applied equally effectively in a case where the reflected wave is separated from the incident wave so that the phase variation of the reflected wave is directly detected for stabilization of oscillation frequency.

Figure 4:
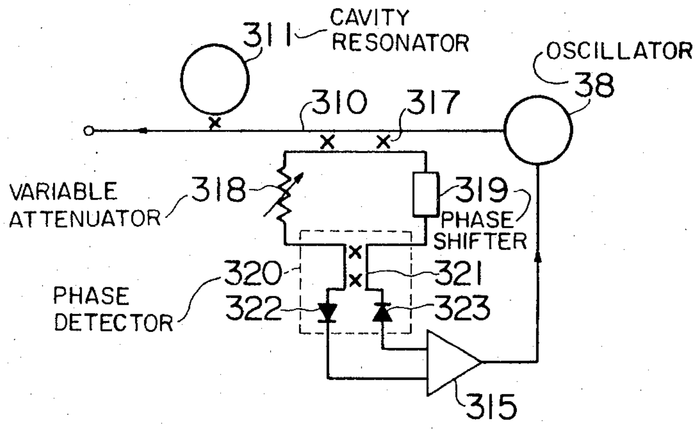
FIG. 4 is a diagram showing another embodiment of the invention.

The construction of the last-mentioned embodiment in which frequency stabilization is achieved by detecting the phase variations of the reflected wave directly is shown in FIG. 4.

In FIG. 4, a fundamental cavity resonator 311 is tightly coupled with the output line 310 of the free running oscillator 38 for the purpose of frequency stabilization by phase locking. The output line 310 is provided with a directional coupler 317 to take out the incident wave and reflected wave.

In the embodiment under consideration, assuming that the output of the oscillator of resonance type is 100 mW and a directional coupler 317 with the degree of coupling of 20 dB is used, the degree of coupling of the fundamental cavity resonator 311 to the line is so determined that the reflected wave is 10 dB less than the incident wave at the time of resonance. The two terminals of the directional coupler 317 are connected, as shown in the drawing, to the variable attenuator 318 and the phase shifter 319, so that a reflected wave signal and an incident wave signal controlled at approximately 1 mW of power are applied to a phase detector 320 from the right and left terminals of the directional coupler 317 respectively. The phase detector 320 comprises a hybrid circuit 321 equivalent to a directional coupler of 3 dB and detecting diodes 322 and 323.

The phase detector 320 so functions that the phase of the reflected wave is detected on the basis of the incident wave and signals of opposite polarities for frequency control are generated from the diodes.

The phase shifter 319 is so adjusted that when the oscillation frequency agrees with the resonance frequency of the oscillator 311, the two detecting diodes 322 and 323 produce outputs of the same level. The outputs from the diodes 322 and 323 are applied to the AFC circuit 315, whereby, as in the embodiment of FIG. 2, the free running oscillator 38 is controlled in such a manner as to eliminate the deviation of the oscillation frequency.

In the event that the directional coupler 317 is arranged at an appropriate position, the phase shifter 319 may be omitted. Also, by improving the degree of coupling of the fundamental cavity resonator 311 and thus increasing the magnitude of the reflected wave sufficiently, it is possible to omit the variable attenuator.

If a matched load, that is, a non-reflection end is connected to the left end of the output line of the embodiment under consideration, the wave reflected from the fundamental cavity resonator undergoes variations by $\pm 90°$ with respect to the incident wave due to the variations in frequency. Therefore, even if the oscillation frequency undergoes variations to such a degree as to exceed the range of phase locking, the polarity of the frequency deflection is easily identified, thus making AFC possible. Further, if total reflection is caused to occur by connecting a load lower in impedance than the characteristic impedance of the line, the phase changes by a maximum of $\pm 180°$ for improved sensitivity of phase detection.

In this connection, it may be needless to say that total reflection may be caused to occur by placing the fundamental cavity resonator at a point of $n \times \frac{1}{2} \lambda g$ (n: an integer) to the rear of the oscillator element where $\lambda g$ is the wavelength of the waveguide.

The preceding embodiment and its modifications have the advantage that frequency variations are detected with more sensitivity than the embodiment shown in FIG. 2.

The above-mentioned solid-state oscillator according to the present invention, having both the phase-locking and noise-restricting characteristics of a stabilized oscillator connected with a well-known resonator as well as the stability of an oscillator comprising the well-known AFC circuit, can achieve an extremely high stability in oscillation as compared with conventional solid-state oscillators.

Furthermore, the present invention is applicable to a transistor oscillator besides the solid-state oscillator with a given negative resistance element.

Also, the waveguide employed in the embodiment may be replaced by a coaxial line or strip line.

What we claim is:

1. A stabilized solid-state oscillator comprising: a free running oscillator means including at least a solid-state oscillator element, a microwave transmission line on which said solid-state oscillator element is mounted, and means for supplying a bias voltage to said solid-state oscillator element; a resonator connected to said microwave transmission line for controlling the oscillation frequency of said free running oscillator means by phase locking; two phase detector means coupled to said microwave transmission line between said free running oscillator and said resonator, said two phase detector means being located at symmetrical positions on said microwave transmission line with respect to a point at which the amplitude of a standing wave at the resonant frequency of said resonator is minimum; and frequency control means for receiving an output of each of said phase detector means and for applying its output to said free running oscillator means to control the frequency thereof to a predetermined value; said phase detector means detecting phase variations of said standing wave due to variations in the oscillation frequency of said free running oscillator in the form of amplitude variations of said standing wave.

2. A stabilized solid-state oscillator according to claim 1, in which said free running oscillator comprises frequency changing means connected to said microwave transmission line for varying the oscillation frequency, said frequency control means applying its output to said frequency changing means.

3. A stabilized solid-state oscillator according to claim 2, in which said frequency changing means comprises a loop connected to said microwave transmission line, a varactor diode connected to said loop, and means for applying a bias voltage to said varactor diode.

4. A stabilized solid-state oscillator according to claim 1, in which each of said phase detector means includes a loop and a diode connected to said loop, said respective loops of said two phase detector means being coupled to said microwave transmission line at said symmetrical positions, said respective diodes of said two phase detector means being arranged in opposite directions to each other and being connected to said frequency control means.

5. A stabilized solid-state oscillator comprising: a free running oscillator means including at least a solid-state oscillator element, a microwave transmission line on which said solid-state oscillator element is mounted, and means for supplying a bias voltage to said oscillator element; a resonator connected to said microwave transmission line for controlling the oscillation frequency of said free running oscillator by phase locking; a directional coupler connected to said microwave transmission line between said solid-state oscillator element and said resonator; means for detecting the phase of wave reflected from said resonator on the basis of incident wave entering said resonator, said reflected wave and incident wave being both obtained through said directional coupler; and frequency control means for receiving an output of said phase detector means and for applying its output to said free running oscillator means to control the frequency thereof to a predetermined value.

6. A stabilized solid-state oscillator according to claim 5, in which saidphase detector means includes means connected to said directional coupler to receive said reflected wave and said incident wave for transmitting said reflected wave and said incident wave, and a pair of diodes connected in opposite directions to each other between the output of said reflected wave and incident wave transmitting means and the input of said frequency control means.

7. A stabilized solid-state oscillator according to claim 5, further comprising a phase shifter connected between said directional coupler and said phase detector means for adjusting the phase of wave reflected from said resonator and a variable attenuator for attenuating the incident wave from said directional coupler.

8. A stabilized solid-state oscillator according to claim 5, in which said microwave transmission line is connected to a load smaller than the characteristic impedance of said line thereby to strengthen the coupling of said resonator.

* * * * *